US010149054B2

(12) United States Patent
Casset

(10) Patent No.: US 10,149,054 B2
(45) Date of Patent: Dec. 4, 2018

(54) OPERABLE MEMBRANES DEVICE AND DIGITAL SPEAKER COMPRISING AT LEAST ONE SUCH DEVICE

(71) Applicant: Commissariat A L'Energie Atomique et aux Energies Alternatives, Paris (FR)

(72) Inventor: Fabrice Casset, Tencin (FR)

(73) Assignee: Commissariat à l'énergie atomique et aux énergies alternatives, Paris (FR)

(*) Notice: Subject to any disclaimer, the term of this patent is extended or adjusted under 35 U.S.C. 154(b) by 9 days.

(21) Appl. No.: 15/057,708

(22) Filed: Mar. 1, 2016

(65) Prior Publication Data

US 2016/0269827 A1  Sep. 15, 2016

(30) Foreign Application Priority Data

Mar. 2, 2015 (FR) ..................... 15 51745

(51) Int. Cl.
*H04R 3/12* (2006.01)
*F04B 43/02* (2006.01)
(Continued)

(52) U.S. Cl.
CPC ............. *H04R 3/12* (2013.01); *B06B 1/02* (2013.01); *F04B 43/021* (2013.01); *H04R 1/005* (2013.01);
(Continued)

(58) Field of Classification Search
CPC .... H04R 1/406; H04R 17/00; H04R 2499/11; H04R 15/00; H04R 17/02; H04R 17/005;
(Continued)

(56) References Cited

U.S. PATENT DOCUMENTS 4,515,997 A * 5/1985 Stinger, Jr. ............. H04R 19/02
  341/151
5,490,220 A * 2/1996 Loeppert ............... B81B 3/0072
  381/113
(Continued)

FOREIGN PATENT DOCUMENTS

EP      2 747 452 A1   6/2014
JP      2013-102024    5/2013
(Continued)

OTHER PUBLICATIONS

Sturtzer et al, High Fidelity MEMS electrodynamic micro speaker characterization, HAL, Jan. 2009.*
(Continued)

*Primary Examiner* — Davetta W Goins
*Assistant Examiner* — Kuassi Ganmavo
(74) *Attorney, Agent, or Firm* — Oblon, McClelland, Maier & Neustadt, L.L.P.

(57) ABSTRACT

An operable membrane device is provided, including a plate, a plurality of membranes suspended from the plate and being a seat of residual mechanical constraints, at least a first actuator configured to deform the plate outside its plane, second actuators, each second actuator being configured to deform a membrane outside its plane, and control electronics configured to generate second control signals at the second actuators in order to vibrate the membranes and configured to generate first control signals at the first actuator to cause a deformation of the plate so that the plate is found in the deformed state, wherein a mechanical constraint is applied to the membranes that at least reduces the residual constraints of the membranes.

18 Claims, 6 Drawing Sheets

(51) Int. Cl.
  *H04R 1/00* (2006.01)
  *H04R 1/24* (2006.01)
  *H04R 1/22* (2006.01)
  *B81B 3/00* (2006.01)
  *B06B 1/02* (2006.01)
  *B81C 1/00* (2006.01)
  *H04R 17/00* (2006.01)
  *H04R 31/00* (2006.01)

(52) U.S. Cl.
  CPC ............... *H04R 1/227* (2013.01); *H04R 1/24* (2013.01); *H04R 31/003* (2013.01); *B06B 1/0292* (2013.01); *B81B 3/0072* (2013.01); *B81B 2201/0257* (2013.01); *B81B 2203/0127* (2013.01); *B81C 1/00158* (2013.01); *H04R 17/005* (2013.01); *H04R 31/00* (2013.01); *H04R 2201/003* (2013.01)

(58) Field of Classification Search
  CPC .... B81B 2203/0127; B81B 2201/0257; B81B 3/0072; B06B 1/0292
  See application file for complete search history.

(56) References Cited

U.S. PATENT DOCUMENTS

| | | | | |
|---|---|---|---|---|
| 6,980,339 | B2* | 12/2005 | Greywall | G02B 26/0841 359/198.1 |
| 7,423,287 | B1* | 9/2008 | U'ren | B81C 99/005 257/48 |
| 7,636,151 | B2* | 12/2009 | Kothari | G02B 26/001 356/35.5 |
| 2005/0134955 | A1* | 6/2005 | Greywall | G02B 26/0841 359/291 |
| 2006/0006484 | A1* | 1/2006 | Seneviratne | B81B 3/0016 257/415 |
| 2013/0205895 | A1* | 8/2013 | Wardle | G01P 15/00 73/488 |
| 2013/0294636 | A1* | 11/2013 | Cassett | H04R 1/02 381/386 |
| 2014/0294226 | A1* | 10/2014 | Suvanto | H04R 1/04 381/398 |
| 2015/0212109 | A1* | 7/2015 | Kang | G01P 15/0922 73/662 |

FOREIGN PATENT DOCUMENTS

WO   WO 2004/019652 A2   3/2004
WO   WO 2016107975 A1 *  7/2016

OTHER PUBLICATIONS

Spiering et al, Membranes fabricated witha deep single corrugation for package stress reduction and residual stress relief, J Micromech Microeng 1993.*

Diamond, Digital Sound Reconstruction Using Arrays of CMOS-MEMS Microspeakers, 2002.*

French Preliminary Search Report dated Nov. 16, 2015 in French Application 15 51745, filed on Mar. 2, 2015 ( with English Translation of Categories of Cited Documents).

Remy Dejaeger "Modelisations multiphysiques, realization et experimentations d'un haut-parleur digital matriciel piezoelectrique MEMS", Universite de Lyon, 2014, 234 pages.

John J. Neumann Jr et al. "CMOS-MEMS membrane for audio-frequency acoustic actuation", Sensors and Actuators A, vol. 95, 2002, 8 pages.

U.S. Appl. No. 15/046,803, filed Feb. 18, 2016, Fabrice Casset et al.

* cited by examiner

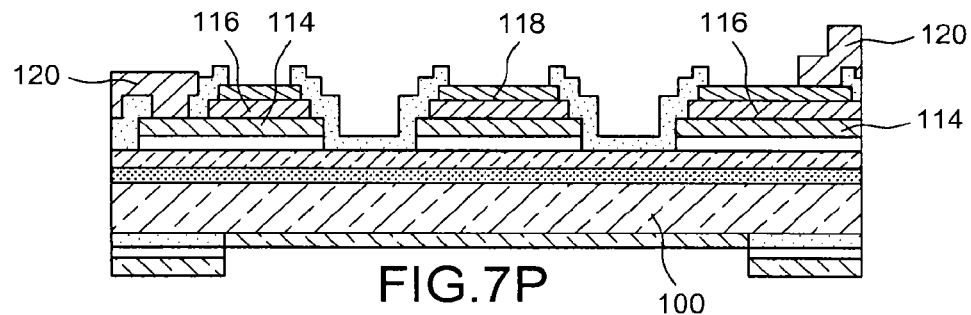
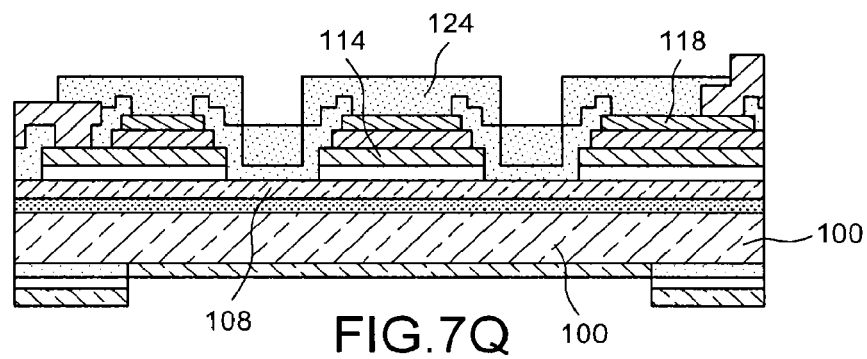
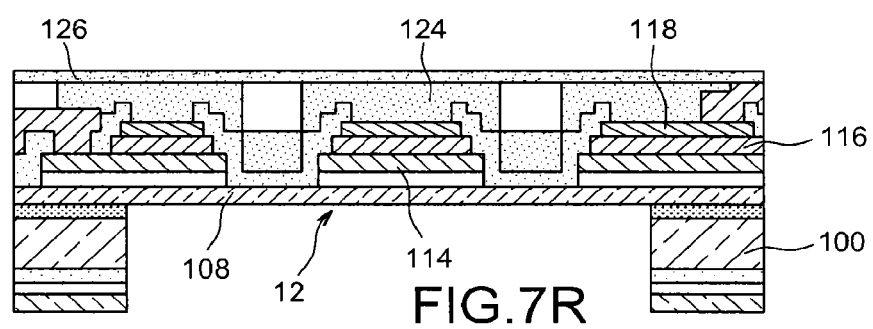

OPERABLE MEMBRANES DEVICE AND DIGITAL SPEAKER COMPRISING AT LEAST ONE SUCH DEVICE

TECHNICAL FIELD AND BACKGROUND OF THE INVENTION

The present invention relates to an operable membranes device and a digital speaker comprising at least one such device.

A digital speaker comprises operable membranes moving air in order to emit sounds.

The development of nomadic devices always offering more functionalities, ever higher performing components, and increasingly integrated are being developed. MEMS components, due to their collective manufacturing method, and the potential for co-integration of different components on the same chip are opening up new prospects for industrialists.

Speakers are components present in a large number of mobile telephone, flat screen, etc. applications, and their miniaturization and integration are becoming key.

MEMS technologies are particularly well suited to producing digital speakers, in which the sound is reconstructed from elementary contributions from a large number of elementary membranes, and more generally ultrafine acoustic transducers or speaklets. Each transducer can be actuated independently, and the sound to be emitted is reconstructed based on the principle of additivity of the elementary sounds of transducers in the air.

One example digital speaker is described in the document Dejaeger et al. *"Development and characterization of a piezoelectrically actuated MEMS digital loudspeaker"*, Proc. Eurosensors XXVI, Sep. 9-12, 2012. In this document, the speaklets use piezoelectric actuation, which makes it possible to give a movement to the speaklets in both directions, and therefore to precisely control the acoustic pulse that they generate.

Nevertheless, it has been observed that the elementary MEMS membranes generate fewer low frequencies when the resonance frequency of the membrane is high. Indeed, if we trace the variation of the surface pressure as a function of the frequency, we see that, before the resonance peak, the pressure increases. This increase, of approximately 12 dB per octave, is related to the mechanical behavior of the membrane, which is dominated by the stiffness. This mechanical behavior approaches a mass-spring system with one degree of freedom. Beyond the resonance peak, the pressure remains constant, since the behavior of the membrane is dominated by the mass.

Furthermore, the resonance frequency of the membrane is higher when the membrane is smaller with a constant thickness. In order to generate low frequencies, it is therefore preferable to implement large membranes.

However, when the speaklet matrix is too large, for example when its diameter is larger than 2500 µm, distortions may appear due to operating differences, i.e., the difference in the journey of the acoustic wave between two transmitters.

Furthermore, the membranes are also subject to residual constraints. In the case of speaklets, the generated resonance frequency is higher when there are residual constraints. Consequently, the presence of these residual constraints hinders the generation of low frequencies.

Furthermore, the existence of these residual constraints, both in digital speakers and other devices implementing operable membranes, makes the behavior of the membranes unpredictable and their control imprecise. Indeed, due to the presence of these residual constraints, the membrane system does not have the anticipated behavior for a planar membrane system.

In light of the preceding, in the case of a device having a large number of membranes or membranes of different sizes, these membranes will therefore have constraint states that may in particular vary as a function of their geographical position on the substrate, and it is not possible to consider using a manufacturing method making it possible to offset these drawbacks for all of the membranes.

BRIEF DESCRIPTION OF THE INVENTION

It is consequently one aim of the present invention to offer an operable membranes device offering increased control precision.

The aim of the present invention is achieved by a device comprising a plate, at least one first actuator able to impose an out-of-plane deformation on the plate, at least two membranes suspended from the plate, second actuators for each of the membranes, each of the second actuators being able to impose an out-of-plane deformation on a membrane, each first and second actuator being controllable individually, and control means of the first and second actuators able to apply a constraint to the membranes via the plate in order to reduce the residual constraints internal to each membrane and advantageously eliminate them.

In other words, one seeks to eliminate these internal residual constraints in the membranes by applying a constraint to them opposing the residual constraints in order to achieve a planar membrane system whereof the behavior is controlled. To that end, the support from which the membranes are suspended is deformed. When the residual constraints are a compression, the outward constraint applied is a traction, and vice versa, when the residual constraints are a traction, the outward constraint applied is a compression.

The type of constraint applied by the deformation of the plate is obtained by deforming the plate in one direction or the other.

The membranes are advantageously made outside the mean plane of the plate, preferably at a face thereof.

The plate is deformed, which will apply a constraint on the membranes, the constraint applied to the membranes being chosen to reduce and preferably cancel out the residual constraints existing in the membranes.

In the case of a digital speaker, the residual constraints being canceled out in the membranes, the latter has a better ability to transmit in the low frequencies.

Advantageously, for example in the case of a digital speaker, the plate can be vibrated such that it generates a low frequency lower than that produced by the second membranes. Very advantageously, the plate is vibrated while it is already deformed, to reduce or even eliminate the residual constraints internal to the membranes.

A subject-matter of the present invention is then an operable membrane device comprising a plate, a plurality of membranes suspended from said plate, said plurality of membranes being the seat of residual mechanical constraints, at least a first actuator able to deform the plate outside its plane, second actuators, each second actuator being able to deform a membrane outside its plane, and control electronics able to generate second control signals at the second actuators in order to vibrate the membranes and able to generate first control signals at the first actuator such that it causes a deformation of the plate so that it is found in the deformed state, which is such that induced mechanical constraints apply to the membranes and at least reduce the residual constraints of the membranes.

Residual constraints of the membranes refer to constraints that can be induced by stacking technologies of the membranes and/or by the technological environment of these membranes, for example the encapsulation housing of the device, the atmospheric environment of the device, and in particular the temperature and pressure. According to the invention, the deformation of the plate, caused by the first actuator, thus makes it possible to compensate all or part of the residual constraints of the membranes independently of their actuation by the second actuators. The induced mechanical constraints can be distributed over the plate uniformly or not, for example depending on the desired result, in particular by acting on the shape of the plate and the position of the first actuator(s).

Advantageously, the induced mechanical constraints applied to the membranes cancel out the residual constraints of the membranes.

Another subject-matter of the present invention is a digital speaker or a hydraulic micro-pump or an ultrasound emission device comprising at least one operable membrane device according to the invention comprising at least one operable membrane device according to the invention.

Another subject-matter of the present invention is a method for manufacturing an operable membrane device according to the invention, comprising the following steps:

a) choosing a number of membranes and the respective dimensions thereof, b) determining the residual constraints in the membranes, c) determining the dimensions of the plate, d) determining the required deformation of the plate to reduce and advantageously cancel out the residual constraints in the membranes, e) manufacturing an operable membrane device comprising a plate having the determined dimensions, at least one first actuator being able to cause the determined deformation of the plate, membranes having the chosen dimensions and second actuators able to vibrate the membranes.

Another subject-matter of the present invention is a method for controlling a digital speaker according to the invention comprising the following steps:

generating a first continuous control signal at the first actuator causing the deformation of the plate, generating second control signals at all or part of the membranes as a function of the sound to be produced.

BRIEF DESCRIPTION OF THE DRAWINGS

The present invention will be better understood based on the following description and the appended drawings, in which.

DETAILED DESCRIPTION OF THE INVENTION

In the following description, the invention will primarily be described in an application to digital speakers, but the present invention applies to other fields, for example that of hydraulic micro-pumps and that of ultrasound emission devices.

Figure 1:
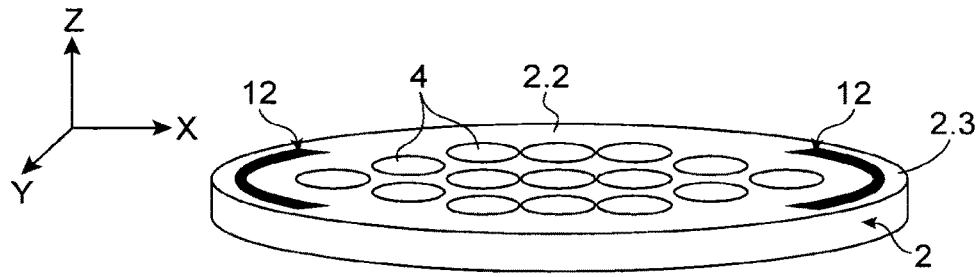
FIG. 1 is a diagrammatic perspective view of one example device according to the invention in the form of a disc.

FIG. 1 shows a diagrammatic example of an operable membrane device that can be implemented in a digital speaker according to one example embodiment.

Figure 2:
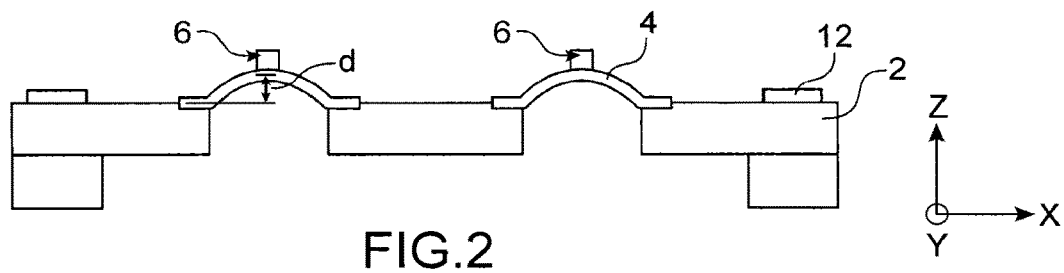
FIG. 2 is a cross-sectional view of an alternative of the device of FIG. 1 comprising fewer membranes.

The device D1 comprises a first element 2 having a plate-shape and second elements forming membranes 4, said membranes 4 being suspended from said plate 2 as shown in FIG. 2. In the illustrated example, the plate 2 is in the form of a disc, as are the membranes 4.

Preferably, the device is made using microelectronics techniques, the first element 2 being a structured substrate.

In the illustrated example, the membranes 4 are made on one face of the plate 4, for example by depositing layers and structuring the substrate and layers.

In FIG. 2, the membranes are shown deformed in order to symbolize the deformation due to the residual constraints. This deformation is not to scale.

The device comprises, for each membrane 4, at least one actuator 6 able to apply an out-of-plane deformation to the membrane 4.

As a variant, the actuators are piezoelectric and/or ferroelectric actuators that can allow an out-of-plane deformation in both directions, i.e., upward and downward in the illustration of FIG. 2, which allows precise control of the acoustic pulses that they generate.

Alternatively and non-limitingly, electrostatic, magnetic, thermal, etc. actuators could be used.

Figure 3A:
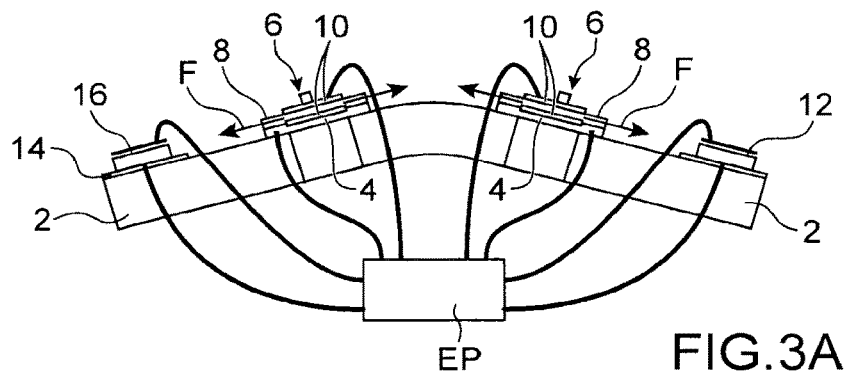
FIG. 3A is a cross-section of the device of FIG. 2 in a first actuating state.
Figure 3B:
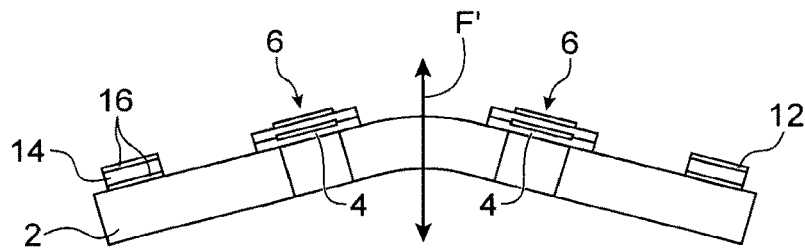
FIG. 3B is a cross-section of the device of FIG. 2 in a second actuating state.

As shown diagrammatically in FIGS. 3A and 3B, the piezoelectric actuators comprise a piezoelectric material 8 and electrodes 10 on either side of the piezoelectric material 8 to apply an electric field to it and cause its deformation.

When an electric field is applied to the piezoelectric material, the latter deforms, while the membrane is not deformed; a thermal switch effect then occurs that results in curving the membrane—piezoelectric material assembly. The direction of the curve varies depending on the electric field applied to the material.

In FIGS. 2, 3A and 3B, the actuators 6 are positioned at the center of the membranes 4 on their face opposite the plate 2.

The device also comprises at least one actuator 12 for applying an out-of-plane deformation to the plate 2.

Preferably, the actuator 12 is also a piezoelectric and/or ferroelectric actuator, but as a variant it could be an electrostatic, magnetic, thermal actuator.

In the example shown in FIG. 1, the device comprises two actuators in the form of arc of circle segments positioned diametrically opposite one another and positioned at the edge 2.3 on the upper face 2.1 of the plate 2 so as to apply a uniformly distributed force to the plate. The actuators 12 are positioned so as not to act on the membranes 4.

The plate 2 is configured to be maintained by its lateral edges to be able to be at least deformed. The maintenance of the plate 2 is diagrammed in FIG. 2.

As for the actuators 6, the actuators 12 comprise a piezoelectric or ferroelectric material 14 and electrodes 16 on either side of the piezoelectric or ferroelectric material 14 to apply a polarization to it and cause its deformation.

Preferably, the actuators of the substrate will be made at the same time as the actuators of the membranes.

Figure 4:
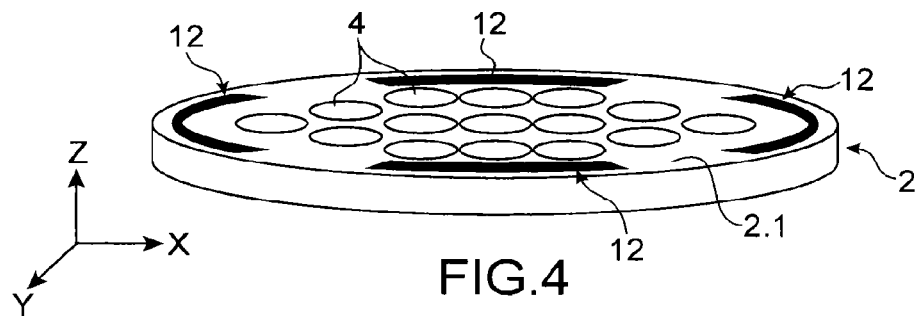
FIG. 4 is a diagrammatic perspective view of one alternative of the device according to FIG. 1.

FIG. 4 shows an alternative embodiment of the device of FIG. 1 comprising four actuators 12 also in the form of arc of circle segments distributed uniformly on the peripheral edge of the plate on its upper face 2.1 of the plate, so as to apply a uniformly distributed force to the plate.

Also as a variant, a single ring-shaped actuator 12 could be implemented, bordering the outer edge of the plate.

The electrodes of the actuators 6 and 12 are separately electrically connected to a polarization source V, the polarization of each pair of electrodes being controlled individually by the control electronics EP.

Preferably, the surface of the actuators 12, 6 is between 5% and 40% of the surface of the plate 2 and the membranes 4, respectively, preferably equal to 25% so as to obtain sufficient actuation with a limited overall dimensions of the actuators.

The dimensions of the plate are chosen so as to allow its out-of-plane deformation by the actuator(s), in particular the thickness of the plate 2 is chosen to allow this deformation while being able to offer enough mechanical rigidity not to buckle.

Preferably, the maximal deformation of the plate caused by the actuators 12 is such that it remains low relative to the dimensions of the plate, for example, the deflection of the maximal deflected shape is approximately several tens of µm. The deformation of the plate is such that it does not damage the plate and does not cause interference to the operation of the membranes.

For example, the plate is made from a semiconductor material, for example silicon, the membranes are for example made from polycrystalline silicon, monocrystalline silicon, oxide, the electrodes are for example made from platinum, ruthenium, etc., and the piezoelectric or ferroelectric material is for example made from PZT, AlN, ZnO or BST, etc.

The operation of this device will be described.

The digital speaker is controlled by control electronics EP that transcribe the sound to be emitted into electrical commands of the individual membranes as well as the plate.

An electric field is applied to the actuator(s) 12 of the plate 2 beforehand in order to cause its out-of-plane deformation and apply a constraint to the membranes 4. The electric field is generated by applying a direct voltage between the electrodes of the actuators 12. Thus, the plate 4 is continuously deformed at least during the operation of the speaker.

The type of constraint applied to the membranes depends on the deformation direction of the plate 2, and therefore the direction of the electric field.

In the case of the illustrated examples where the membranes are formed on the upper face of the plate, if the plate is deformed downward, a compression is applied to the membranes 4, which makes it possible to compensate the residual tension constraints existing in the membranes 4. If the plate 2 is deformed upwardly, tension is applied to the membranes, which can offset the residual compression constraints existing in the membranes. Conversely, if the membranes were on the lower face of the plate, compression would be applied while deforming the plate upwardly and tension would be applied while deforming the plate downwardly.

The amplitude of the deformation of the plate depends on the value of the electric field applied to the actuator(s) 12.

The membranes 4 are next vibrated based on the sound to be reproduced by polarizing all or part of the actuators of the membranes 4 using an alternating voltage or using a voltage comprising an alternating component and a direct component in the case of ferroelectric materials such as PZT.

Due to the compensating pre-stress applied to all of the membranes 4 by the deformation of the plate 2, which reduces and advantageously eliminates the residual constraints in the membranes, the membrane system has a behavior close to that, or the actual behavior, of a planar membrane system which is controlled.

In the case of a digital speaker, having canceled these internal constraints allows the membranes 4 to operate at a lower frequency than when the internal constraints are not compensated. Owing to the compensation of the internal constraints, the frequencies can be lowered by several tens of percentage points.

In FIG. 3A, one can see the plate 2 deformed upwardly under the action of the actuators 12. Setting the membranes 4 in an out-of-plane vibration results in the thermal switch effect following the deformation in the plane of the actuators symbolized by the arrows F.

The plate can be deformed only to reduce the residual constraints and not to cancel them out. This can be interesting in the case where the plates can, from a constraint threshold, become bistable. The partial compensation of the constraints may for example prevent this phenomenon.

Very advantageously, superimposed on the permanent direct deformation voltage is an alternating voltage that also applies between the electrodes of the actuators 12 to vibrate the plate 2 such that it generates a low frequency, itself forming a membrane of the digital speaker, the sound produced by the plate 2 being added to the sounds produced by the membranes 4. The plate is dimensioned to be able to generate low frequencies.

Due to the large surface area of the plate 2 relative to the membranes 4, it is able to generate low frequencies lower than those generated by the small membranes, and is therefore complementary in the reproduction of sound. The plate may for example generate frequencies from several hundred Hz to several kHz, while the membranes will generate frequencies from several kHz to several tens of kHz, or even several hundred kHz.

The alternating voltage is applied when lower frequencies have to be generated. The alternating voltage is applied briefly, for example during a duration of several µs to several ms depending on the geometry of the plate, in order to cause a brief movement of the plate around its position able to partially or completely offset the residual constraints. This movement makes it possible to generate a low-frequency sound pulse.

The frequency of the first resonance mode of a substrate embedded on its periphery can be expressed approximately by the following formula:

$$f_0 = 0.47 \frac{t}{a^2} \sqrt{\frac{E}{\rho}}$$

With t the thickness of the multilayer, a the radius, E and ρ the average Young's modulus and the average density of the multilayer, respectively.

Figure 6:
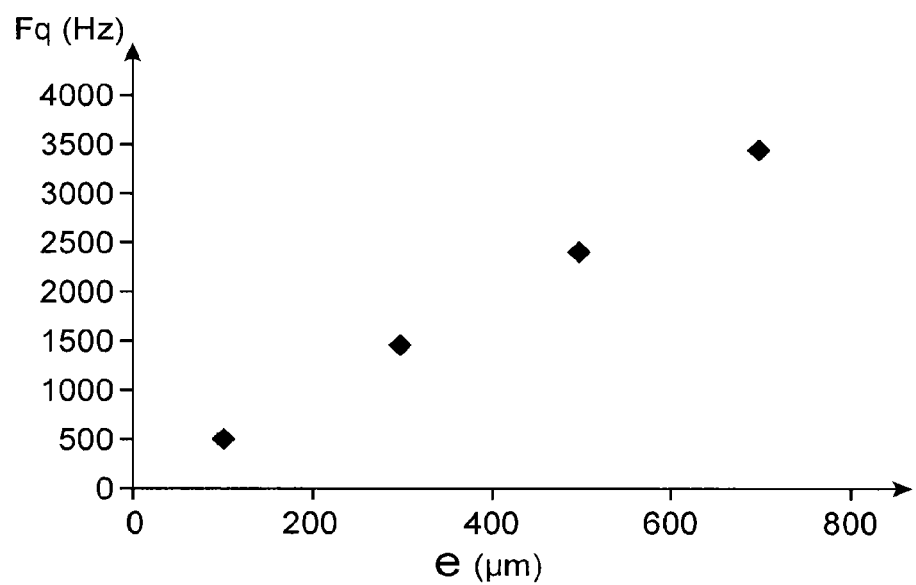
FIG. 6 is a graphic illustration of the variation of the frequency of the digital speaker based on the thickness of the substrate.

FIG. 6 shows the variation of the resonance frequency Fq in Hz as a function of the thickness e in µm of a plate with a radius of 2 cm. One can see that it is possible to obtain a resonance frequency, and therefore an acoustic contribution, of approximately 500 Hz, corresponding to a sensation of bass with a plate having a thickness of 100 µm. This thickness can easily be obtained by chemical mechanical polishing (CMP), for example this thickness of 100 µm can be obtained from a substrate 725 µm thick, which is standard in microelectronics.

The alternating voltage applied to the actuators of the plate and the alternating voltages applied to the actuators of the membranes 4 are applied successively.

In FIG. 3B, the vibration of the plate 2 is symbolized by the arrow F'.

A digital speaker in which only a direct voltage is applied to the actuators 12 of the plate does not go beyond the scope of the present invention. Furthermore, it is possible to provide that the plate 2 is vibrated by applying an alternating voltage without a direct voltage being applied. The plate is then alone in generating a sound, the digital speaker then working as an analog speaker.

It will be understood that one could consider having a large plate comprising several plates 2 each bearing membranes 4, the large plate being able to be deformed to offset the residual constraints in the plates 2 making up the membranes, and the plates 2 being deformed to offset the residual constraints of the membranes. This stratification can be repeated several times.

Figure 5:
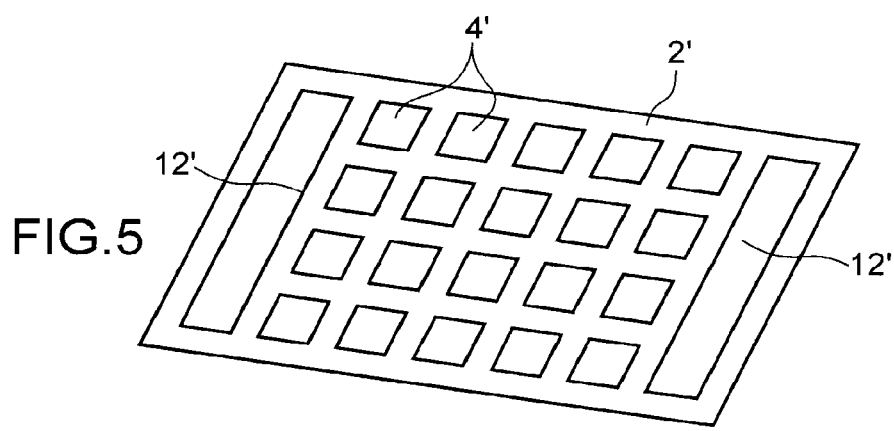
FIG. 5 is a diagrammatic perspective view of one example device with a rectangular shape.

FIG. 5 shows another example embodiment in which the plate 2' is rectangular, the membranes 4' are square and comprise two actuators 12' in strip form each positioned along an opposite edge of the plate. The membranes 4' could have another shape, for example a disc shape, a rectangular shape, etc.

The plate could have another form, for example any polygonal form.

The membranes 4 of the plate 2 are dimensioned so that the deformation of the plate best offsets the residual constraints present in the membranes.

If we consider a system XYZ, with XY the plane of the plate, the dimensions of the plate 2 in the plane XY are generally determined by the number and dimensions of the membranes 4, which are set by the sound volume, the definition of the desired sound, etc. The value of the constraint applied by the deformation of the membrane can then be set by choosing the dimension in the Z direction of the membrane, i.e., its thickness.

Nevertheless, it is possible to dimension the device by varying not only the thickness of the plate, but also its surface, or then only its surface.

The design of the device according to the invention may comprise the following steps:

1—Measuring the stray deformation of the membranes caused by the constraints,

2—extracting constraints from the deformation by using analytic formulas or calculation using the finite elements method, 3—choosing the voltage and therefore deformation to be applied on the plate, which will be able to compensate the constraints on the membranes.

The constraints in a membrane 4 as manufactured for speaker applications is approximately several hundred MPa, typically 300 MPa.

If one considers a silicon plate 4 measuring 4×4 cm², a thickness of 100 µm makes it possible to obtain a deflection of approximately 48 µm under a voltage of 50 V. This deformation makes it possible to cause a constraint of approximately 50 MPa. Below 200 V, a deformation of 97 µm is obtained, and causes a constraint of more than 1800 MPa. We therefore see that a voltage between 50 V and 200 V will be able to offset the residual constraints in the membranes 4. These deformations are for example obtained by implementing two actuators as shown in FIG. 1.

Advantageously, the shape and size of the actuators are determined so as to limit the actuating voltage as a function of the geometry of the plate.

The shape and size of the actuators are for example determined using the finite elements method, for example using the CoventorWare®, COMSOL®, ANSYS® programs.

The device according to the invention is in particular advantageous in producing digital speakers, since it makes it possible to generate low frequencies, and advantageously two levels of low frequencies by using the plate as a membrane. The speakers then offer better sound quality.

The device according to the present invention can be applied in all technical fields in which membranes able to vibrate can be implemented. For example, it can be used in a micro-pump to displace liquid, the membranes displacing a certain volume and the plate advantageously displacing another volume. The compensation of the internal constraints makes it possible to have a known and controlled behavior of the membranes. The device according to the invention can also be used in ultrasound emission devices.

One example method for producing a device according to the invention will now be described. It advantageously involves a method implementing microelectronics techniques. This example method illustrates the production of a device with two actuators per membrane implementing a ferroelectric material. This example method also applies to producing a membrane actuator implementing a piezoelectric material such as AlN.

Figure 7A:
FIGS. 7A to 7R are diagrammatic illustrations of steps of an example method for producing a device according to the invention.

The steps shown diagrammatically in FIGS. 7A to 7R show a detail of the device at a membrane 4. However, it will be understood that all of the membranes are made simultaneously in a substrate forming the plate. Advantageously, the actuators of the plate are made at the same time as the actuators of the membranes.

For example, a silicon substrate 100 will be used and is shown partially in FIG. 7A, for example having a thickness of 725 µm and a diameter of 200 mm. Preferably, one will start from a standard substrate on which several devices will be made, for example with a diameter of 4 cm or a diameter of 6 cm. At the end of the production method, the substrate is cleaved in order to separate the devices.

Figure 7B:
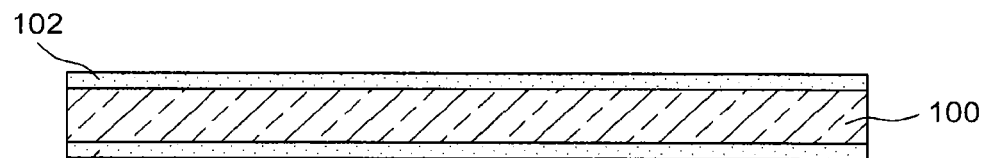

During a first step, a thermal oxidation of the substrate is done so as to form an oxide layer 102 over all of the surfaces of the substrate with a thickness of 2 µm, for example. The element thus obtained is shown in FIG. 7B.

Figure 7C:
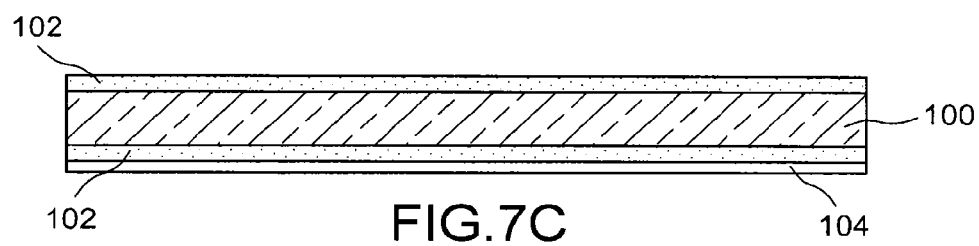

Next, a hard oxide mask 104 is produced on the rear face of the substrate. This mask for example has a thickness of 7 µm. The mask is made by turning over the substrate; based on the chosen deposition composition, it is possible only to deposit the mask on this face. This for example involves a deposition of the PVD (Physical Vapor Deposition) type. The element thus obtained is shown in FIG. 7C.

Figure 7D:
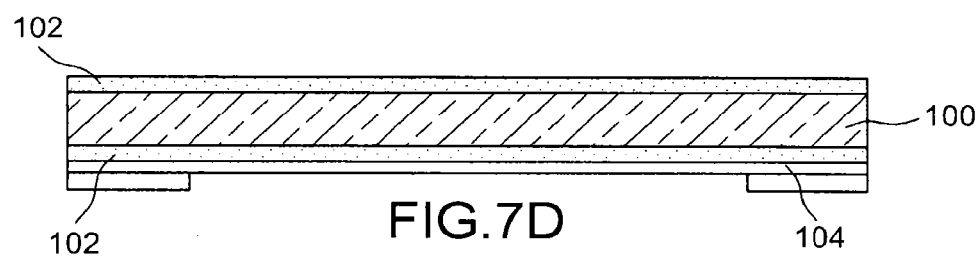

Lithography is next done on the hard mask. The element thus obtained is shown in FIG. 7D.

Figure 7E:
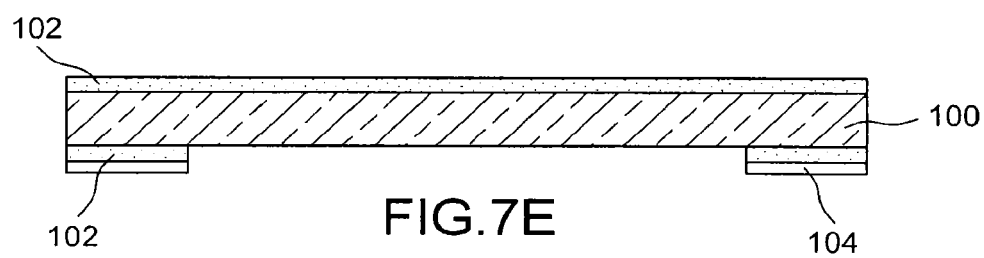

During a following step, one etches, for example by reactive ion etching (RIE), the hard mask and the oxide layer 102 on the rear face so as to reach the rear face of the substrate 100. The element thus obtained is shown in FIG. 7E.

Figure 7F:
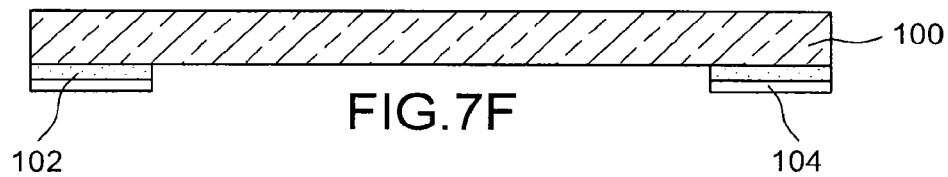

During a following step, the oxide layer is removed from the front face, for example by deoxidation or chemical etching. The element thus obtained is shown in FIG. 7F.

Figure 7G:
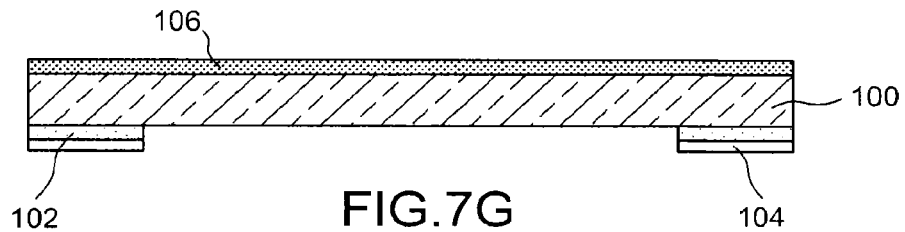

During a following step, an oxide layer 106 is formed on the front face. Advantageously, densification annealing is for example done at a temperature of approximately 800° C. The element thus obtained is shown in FIG. 7G.

During a following step, a layer 108 is formed on the front face intended to form the membrane 2, and a layer 110 on the rear face. Preferably, these layers are for example made from a polysilicon, SiC or SiO$_2$. The thickness of the layers 108, 110 is for example comprised between several hundred nm and several μm, or even several tens of μm.

The layers 108, 110 are for example made by chemical vapor deposition (CVD) or by epitaxial growth. Preferably, the constraints of the layers 108, 110 are controlled.

The layers 108, 110 can be formed in several operations. For example, for a thickness of 4 μm, two layers 1.5 μm thick and 1 layer with a thickness of 1 μm are produced successively.

Figure 7H:
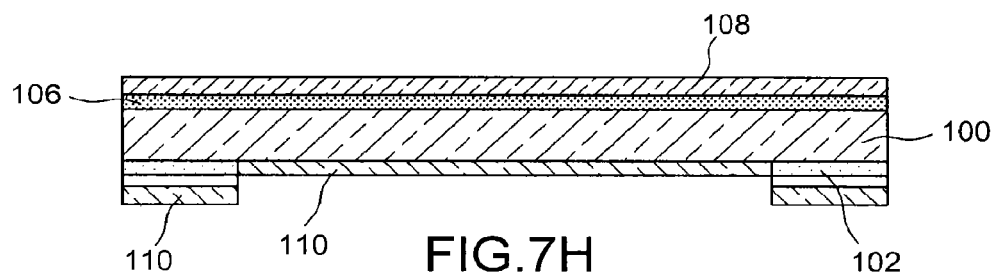

Advantageously, an annealing step is next done. The element thus obtained is shown in FIG. 7H.

During a following step, a layer 112 is formed on the layer 108, for example made from SiO$_2$ or SiN, for example having a thickness comprised between several hundred nm and several μm. The layer 112 is for example formed by thermal oxidation or by CVD. Advantageously, a densification annealing takes place, for example at a temperature of about 800° C.

Figure 7I:
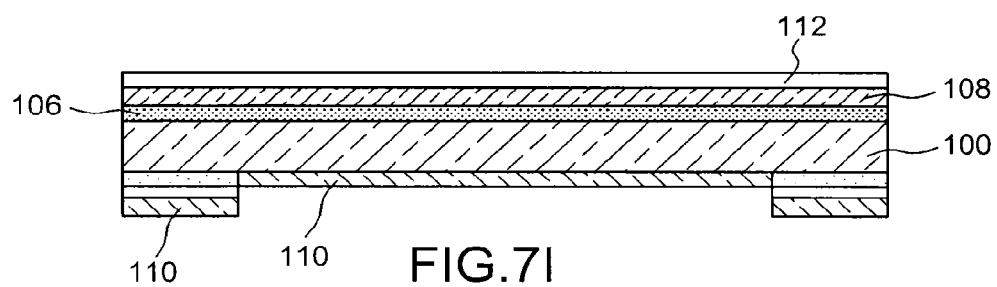

The element thus obtained is shown in FIG. 7I.

During a following step, the first and second actuators are produced.

Figure 7J:
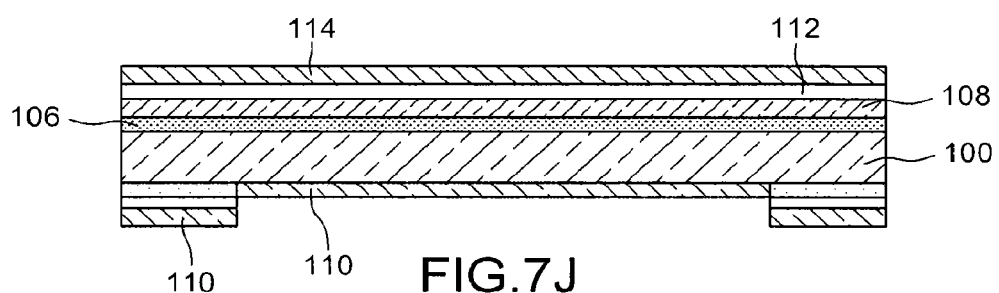

To that end, one first produces a layer 114 designed to form the lower electrodes of the actuators, for example made from Pt or Mo. The layer 114 is for example made by deposition on the layer 112. The layer 114 for example has a thickness comprised between several tens of nm and several hundred nm. The element thus obtained is shown in FIG. 7J.

A layer of ferroelectric material 116 is next formed on the layer 114, for example PCT, ZnO, LNO, the thickness of which is for example comprised between several hundreds of nm to several μm. As a variant, the layer 116 could be a piezoelectric material, in particular when a single actuator is produced.

Figure 7K:
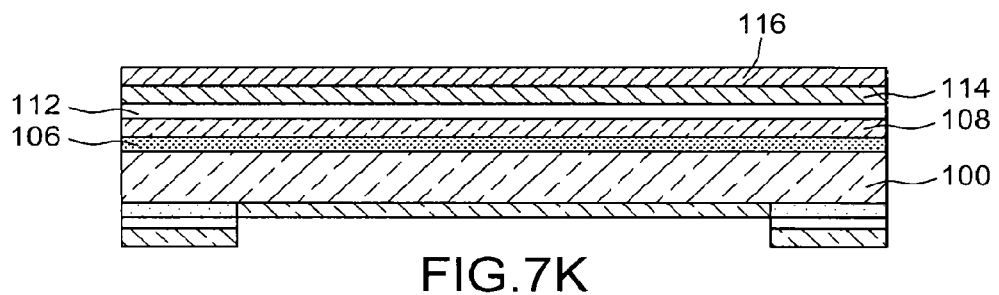

The upper electrode is next produced by forming a layer 118 on the piezoelectric material 116, for example made from Ru or Au, for example with a thickness comprised between several tens of nm to several hundred nm. The element thus obtained is shown in FIG. 7K.

The etching steps next take place.

First, the layer 118 is etched so as to define the annular actuator 8 and the disc-shaped actuator 10.

Next, the layer 116 of piezoelectric material is etched.

Figure 7L:
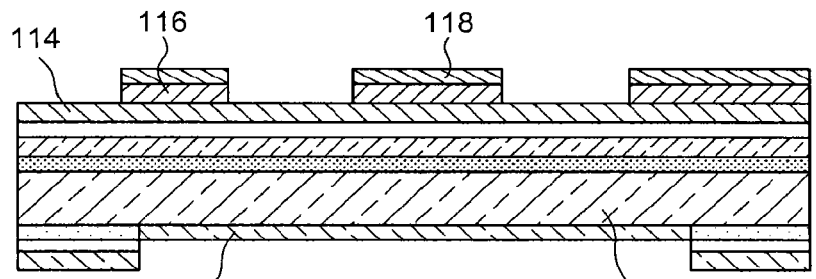

The element thus obtained is shown in FIG. 7L.

Next, the remaining layer portions 118 are etched again such that they are removed relative to the layer portions 116.

Figure 7M:
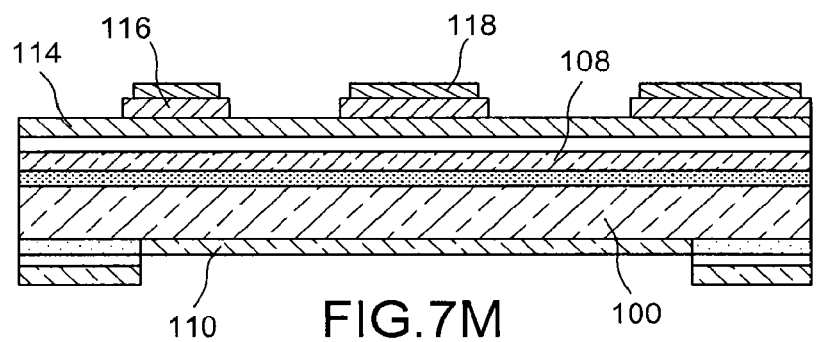

The layer 114 is next etched, as well as the oxide layer 112. The element thus obtained is shown in FIG. 7M.

Figure 7N:
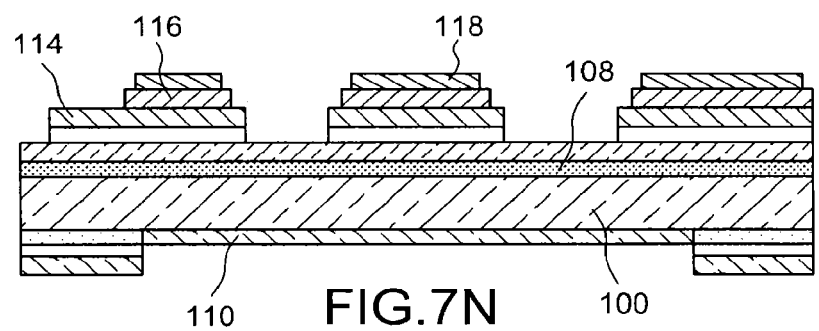

Preferably, a stair profile is produced. This is obtained because all of the layers are deposited, then etched, from the upper layer, using different photolithography masks, the second mask being wider than the first, etc. This makes it possible to leave safety margins to avoid overlapping layers, which could appear due to the positioning uncertainty of the masks. One thus avoids any electric short-circuit between the electrodes. The element thus obtained is shown in FIG. 7N.

Figure 7O:
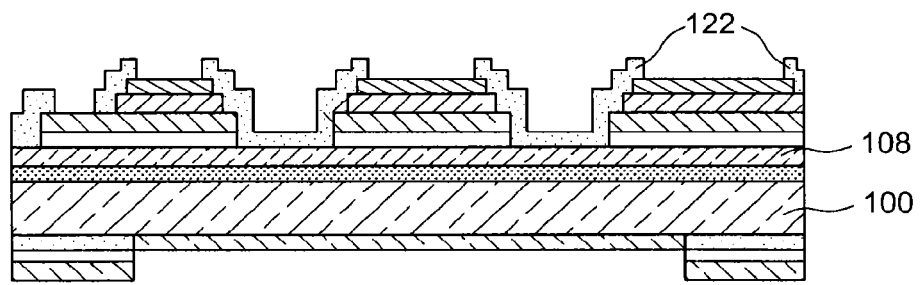

During the following steps, contact pads 120 are formed. Beforehand, a layer 122 of dielectric material is formed, for example in SiO$_2$, on the edges of the stacks formed by the lower, upper electrodes and the piezoelectric material, this layer being etched so as to partially free the lower and upper electrodes. The element thus obtained is shown in FIG. 7O.

Next, a layer, for example of AlSi or TiAu, is formed and etched, thus forming contact pads at the zones where the electrodes have been released. The element thus obtained is shown in FIG. 7P.

Advantageously, during the following step, a protective layer 124 is formed on the actuators, for example an oxide layer, in order to protect the actuators from contact with the stop elements. The thickness of this layer can be comprised between several hundred nm and several μm, for example 500 nm.

During a following step, the layer 124 is etched, to access the contacts.

The element thus obtained is shown in FIG. 7Q.

Preferably, during a following step, the actuators are protected, for example by depositing a dry film 126. Next, the rear face is etched so as to free the membrane 2.

The membrane is released by deep etching of the substrate by the rear face until reaching the membrane. All of the membranes are in fact released at the same time.

The element thus obtained is shown in FIG. 7R.

In order to have a functional device, we can cut the substrate in order to individualize the plates. The obtained element is next associated with other elements, in particular with control electronics connected individually to each of the electrodes. Furthermore, the plate provided with the membranes can itself be mounted on the support to be able to be deformed and advantageously able to vibrate.

The invention claimed is:

1. An operable membranes device, comprising:
   a plate;
   membranes suspended from the plate, the membranes being subject to residual mechanical constraints;
   at least one first actuator configured to deform the plate outside its plane;
   second actuators, each second actuator being configured to deform one of the membranes outside its plane; and
   control electronics configured to generate second control signals at the second actuators in order to vibrate the membranes and configured to generate first control signals at the at least one first actuator to cause a deformation of the plate,
   wherein the deformation of the plate reduces the residual mechanical constraints of the membranes.

2. The operable membrane device according to claim 1, wherein deformation of the plate cancels out the residual mechanical constraints of the membranes.

3. The operable membrane device according to claim 1, wherein the control electronics are further configured to generate additional control
   signals at the at least one first actuator in order to cause the plate to vibrate, independently of the deformation of the plate.

4. The operable membrane device according to claim 3, wherein the additional control signals causing the vibration of the plate are alternating signals.

5. The operable membrane device according to claim 1, wherein the first control signals causing the deformation of the plate are continuous signals.

6. The operable membrane device according to claim 1, wherein the at least one first actuator and/or the second actuators are piezoelectric and/or ferroelectric actuators.

7. The operable membrane device according to claim 1, wherein the total surface of at least one first actuator is between 5% and 40% of the surface of the plate and/or wherein the total surface of the second actuators is between 5% and 40% of the total surface of the membranes.

8. The operable membrane device according to claim 1, wherein the at least one first actuator comprises several first actuators distributed along at least one edge of the plate.

9. The operable membrane device according to claim 8, wherein the plate is in the form of a disc and the first actuators are in the form of an arc of circle centered on the center of the disc.

10. The operable membrane device according to claim 8, wherein the plate is in the form of a rectangle and the several first actuators extending parallel to at least two opposite edges of the plate.

11. The operable membrane device according to claim 8, wherein the plate is in the form of a disc and the first actuators are in the form of a ring centered on the center of the disc.

12. The operable membrane device according to claim 1, wherein the membranes are situated on one face of the plate.

13. A digital speaker comprising at least one operable membrane device according to claim 1.

14. A hydraulic micro-pump comprising at least one operable membrane device according to claim 1.

15. A ultrasound emission device comprising at least one operable membrane device according to claim 1.

16. A controlling method for controlling a digital speaker comprising at least an operable membranes device comprising a plate, membranes suspended from said plate, the membranes being subject to residual mechanical constraints, at least one first actuator configured to deform the plate outside its plane, second actuators, each second actuator being configured to deform one of the membranes outside its plane, and control electronics configured to generate second control signals at the second actuators in order to vibrate the membranes and configured to generate first control signals at the at least one first actuator to cause a deformation of the plate, wherein the deformation of the plate reduces the residual mechanical constraints of the membranes, the controlling method comprising:

generating a first continuous control signal at the at least one first actuator causing the deformation of the plate; and generating second control signals at all or part of the second actuators as a function of a sound to be produced.

17. The controlling method according to claim 16, further comprising generating an additional control signal of alternating type at the at least one first actuator for vibrating the plate.

18. The controlling method according to claim 17, wherein the additional control signal is generated while the first continuous control signal is generated.

* * * * *